(12) United States Patent
Steffan et al.

(10) Patent No.: US 6,338,001 B1
(45) Date of Patent: Jan. 8, 2002

(54) IN LINE YIELD PREDICTION USING ADC DETERMINED KILL RATIOS DIE HEALTH STATISTICS AND DIE STACKING

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/255,108

(22) Filed: Feb. 22, 1999

(51) Int. Cl.[7] .......................... G06F 19/00; G01R 31/26
(52) U.S. Cl. ..................... 700/121; 700/110; 438/14; 438/16
(58) Field of Search ................... 700/108–110, 121; 438/14, 16

(56) References Cited

U.S. PATENT DOCUMENTS

| | | | | |
|---|---|---|---|---|
| 6,154,714 A | * | 11/2000 | Lepejian ..................... | 702/118 |
| 6,177,287 B1 | * | 1/2001 | Steffan et al. ................ | 438/14 |
| 6,185,511 B1 | * | 2/2001 | Steffan et al. ................ | 702/81 |

* cited by examiner

Primary Examiner—William Grant
Assistant Examiner—Elliot Frank
(74) Attorney, Agent, or Firm—H. Donald Nelson

(57) ABSTRACT

A method of manufacturing and inspecting semiconductor devices wherein defects on inspection wafers are tabulated in a stacked defect table wherein a defect table for each layer is generated per die number and a calculated cumulative die health statistic using an automatic defect classification system and a kill ratio for each defect. The cumulative die health statistic is carried over to the next defect table generated for the next layer.

4 Claims, 4 Drawing Sheets

IN LINE YIELD PREDICTION USING ADC DETERMINED KILL RATIOS DIE HEALTH STATISTICS AND DIE STACKING

BACKGROUND OF THE INVENTION

1. Field of the Invention

This invention relates generally to a method of manufacturing high performance semiconductor devices and a method of inspecting the high performance semiconductor devices during manufacturing processing. More specifically, this invention relates to a method of predicting yield during processing of the high performance semiconductor devices. Even more specifically, this invention relates to a method of predicting yield during processing of the high performance semiconductor devices using automatic defect classification determined killer ratios, die health statistics and die stacking.

2. Discussion of the Related Art

In order to remain competitive, a semiconductor manufacturer must continually increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects occurring during the manufacturing process. The number of good chips obtained from a wafer determines the yield. As can be appreciated, chips that must be discarded because of a defect increase the cost of the remaining usable chips.

Each semiconductor chip requires numerous process steps such as oxidation, etching, metallization and wet chemical cleaning. In order to etch metal lines, for example, a layer of photoresist is formed on the surface of the semiconductor chips and patterned by developing the photoresist and washing away the unwanted portion of the photoresist. Because the metal lines and other metal structures have "critical" dimensions, that is, dimensions that can affect the performance of the semiconductor chip, the process of forming the photoresist pattern for each layer is examined during the manufacturing process. Some of these process steps involve placing the wafer in which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

In the course of modern semiconductor manufacturing, semiconductor wafers are routinely inspected using "scanning" tools to find defects. A scanning tool determines the location and other information concerning defects that are caught and this information is stored in a data file for later recapture and inspection of any of the defects. These data files are stored in a relational database that has the ability to generate wafer maps with defects shown in their relative positions. The data database typically has the ability to send these wafer map files to various review tools within the manufacturing plant. This is very useful as it allows for re-inspection on various after-scan inspection tools within the manufacturing plant. These inspection tools include Optical Microscopes and Scanning Electron Microscopes (SEMs) that allow for classification of the defects. Images taken on the various after-scan inspection tools can be linked by linkage data to the defect on a wafer map and reviewed at a workstation at the convenience of an engineer or technician.

In order to be able to quickly resolve process or equipment issues in the manufacture of semiconductor products a great deal of time, effort and money is expended on the capture and classification of silicon based defects. Once a defect is caught and properly described, work can begin in earnest to resolve the cause of the defect, to attempt elimination of the cause of the defect, and to determine adverse effects of the defect on device parametrics and performance.

In the course of typical semiconductor manufacturing and processing of semiconductor wafers a great deal of effort is increasingly being placed on determining the quality of the wafers from a defect viewpoint. This is commonly measured in terms of defectivity, defined as defects/$cm^2$ or per cent defective die. Additionally, it is becoming increasingly prevalent for semiconductor wafers undergoing a manufacturing process to be inspected at numerous processing steps during a process flow. While defectivity gives an indication of the quality of the wafer at a given inspection, it does not provide the desired information, that is, how many die were killed at this step. In addition, there is no indication of how the defects from previous inspections may affect the wafer at the current inspection, unless the defects were caught in a previous layer (a propagator, which is a defect that is caught on a first layer and a subsequent layer inspection).

In the typical ADC (automatic defect classification) methodology, after a scan tool has captured defects, the defects are recaptured and reviewed on an optical review tool and automatically classified by the methodology of automatic defect classification (ADC). In an ADC methodology, the ADC tools have been programmed to recognize parameters, called descriptors, of a defect, assign values to the parameters and to classify the defect based upon the values assigned to the defect. U.S. Pat. No. 5,862,055, "ADC INDIVIDUAL DEFECT PREDICATE VALUE RETENTION AND USAGE and U.S. patent application, Ser. No. 08/896,341, "AUTOMATIC DEFECT CLASSIFICATION (ADC) RECLASSIFICATION ENGINE", both of which are enclosed by reference in their entirety, describe the ADC methodology. The classification information is sent to a relational database, which is part of a defect management system (DMS). The classification information can be retrieved for further processing, analysis, off-line viewing, charting and other analysis procedures. With the advent of ADC and the availability of large databases it would be advantageous to be able to assign a killer or kill ratio to any particular defect. It would be advantageous to tabulate the defect and the associated defect kill ratio on each layer. It would also be advantageous to determine and store a die health statistic for each die at each inspection layer. In addition, it would be of great benefit to have the ability to combine the die health statistics from all the inspections to give a "stacked" or overall wafer health statistic.

Therefore, what is needed is a methodology that determines and assigns killer ratios based on ADC classifications, tabulates the defects per layer and the associated defect kill ratio, calculates die health statistics for every die, and determines wafer health statistics for every layer as well as the stacked wafer health statistic for the current layer.

SUMMARY OF THE INVENTION

According to the present invention, the foregoing and other objects and advantages are attained by a method of manufacturing high performance semiconductor integrated devices in which defects are captured and a kill ratio is used to analyze the semiconductor process.

In accordance with an aspect of the invention, layers on a manufacturing lot of semiconductor wafers are processed, at least one inspection wafer is inspected for defects in a scan tool which generates defect information. The defects captured by the scan tool are reviewed in an ADC classification tool and the classification information is correlated with kill ratio information by a defect management system.

In accordance with a first embodiment of the invention, the classification (type) of defects and associated kill ratio is tabulated in a defect table.

In accordance with an aspect of the first embodiment of the invention, a defect table is generated for each of the processed and inspected layers.

In accordance with a second embodiment of the invention, the classification (type) of defects and kill ratio are correlated and the die number having the defect and the kill ratio are tabulated in a stacked defect table. A die health statistic is calculated from the kill ratio for each die for each layer. The die health statistics for each layer is carried over to the next defect table and is used to calculate a cumulative die health statistic.

The method of the present invention thus provides a semiconductor manufacturing and inspection process for the manufacture of high performance integrated circuits that provides a first defect table in which defect type and associated kill ratios are tabulated by layer and a second stacked defect table in which the number of dice having defects and a calculated die health statistic are tabulated per layer. A cumulative die health statistic is determined per die and is carried over to the next layer defect table. The tabulated data is utilized to predict yield and analyze the manufacturing process.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention, which illustrate the best mode presently contemplated by the inventors for practicing the invention.

Figure 1:
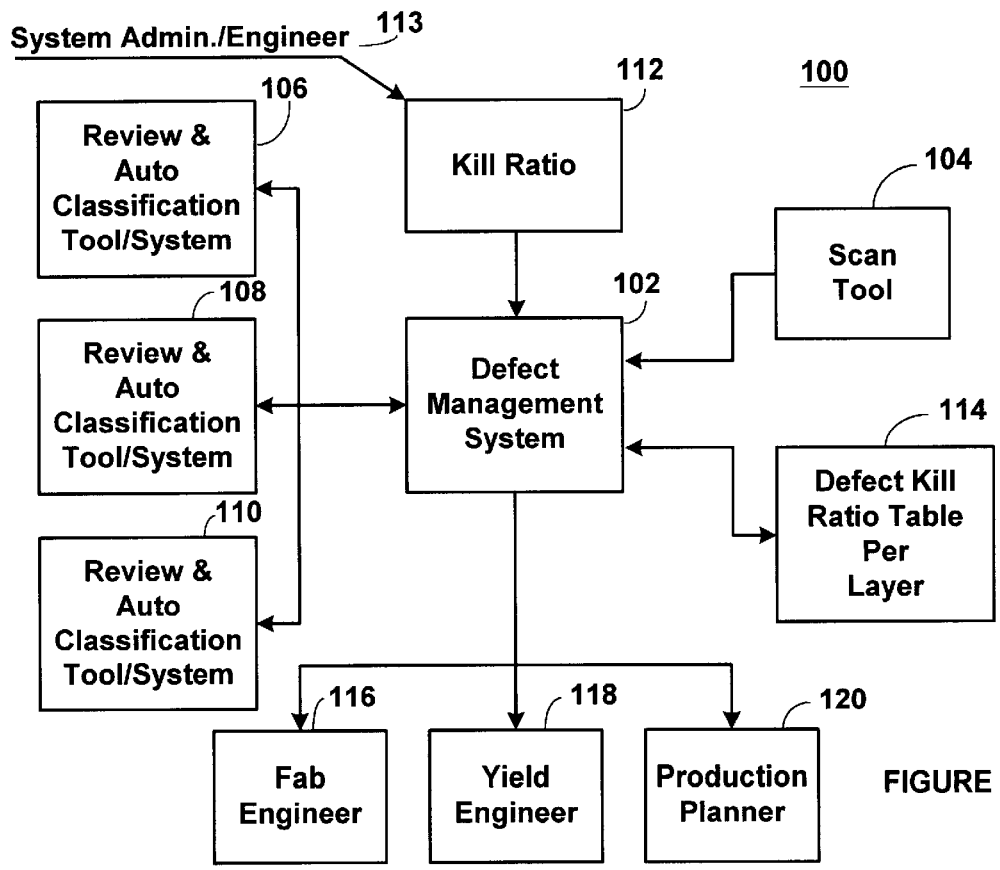
FIG. 1 illustrates an inspection methodology in accordance with a first embodiment of the present invention showing a defect management system having input from a scan tool, input from a kill ratio table, outputs and inputs to and from review and automatic classification tools, outputs to various after inspection stations, including a station manned by a fabrication engineer, a station manned by a yield engineer, and a station manned production planner, and an output and an input to and from a defect kill ratio table tabulated by layer.

FIG. 1 illustrates all inspection methodology 100 showing a defect management system 102 having input from a scan tool 104 that is used to inspect wafers after selected process steps. The scan tool 104 captures defects and sends defect information and defect location information to the defect management system 102, which includes a relational data base. Tile defect management system 102 sends the defect information to review and automatic classification tool/systems 106, 108, and 110, which recapture the defects and automatically classifies the defects as to type and size and then sends the defect classification information back to the defect management system 102. The defect classification information is correlated with kill ratio information tabulated in a kill ratio table 112 that has been developed by a system administrator/system engineer, as indicated at 113. A defect kill ratio is determined for each defect and the kill ratio is tabulated in a defect kill ratio table 114 where the defects and associated defect kill ratios are tabulated for each layer. The kill ratio is a number assigned to a defect type based on the probability of the particular defect type causing the die to fail (or to kill the die). The kill ratio ranges from 0 to 1 where, for example, a kill ratio of 1 would be considered to have a 100% probability of killing the die. Similarly, a kill ratio of 0.5 for a defect would only kill the die 50% of the time. The defect information and associated defect kill ratio tabulated in the defect kill ratio table 114 would be analyzed to determine an overall yield prediction. The defect information stored in the defect management system 102 is available for inspection at review stations such as at a station 116 manned by a fabrication engineer, a station 118 manned by a yield engineer, and a station 120 manned by a production planner. As can be appreciated, the fabrication engineer studies the defect information to develop fabrication procedures or to find cures for problems identified during the inspection process, the yield engineer studies the defect information to predict yield information or to develop methods to increase the yield and the production planner studies the defect information to determine if there are methods to increase or improve the production of the semiconductor wafers.

Figure 2:
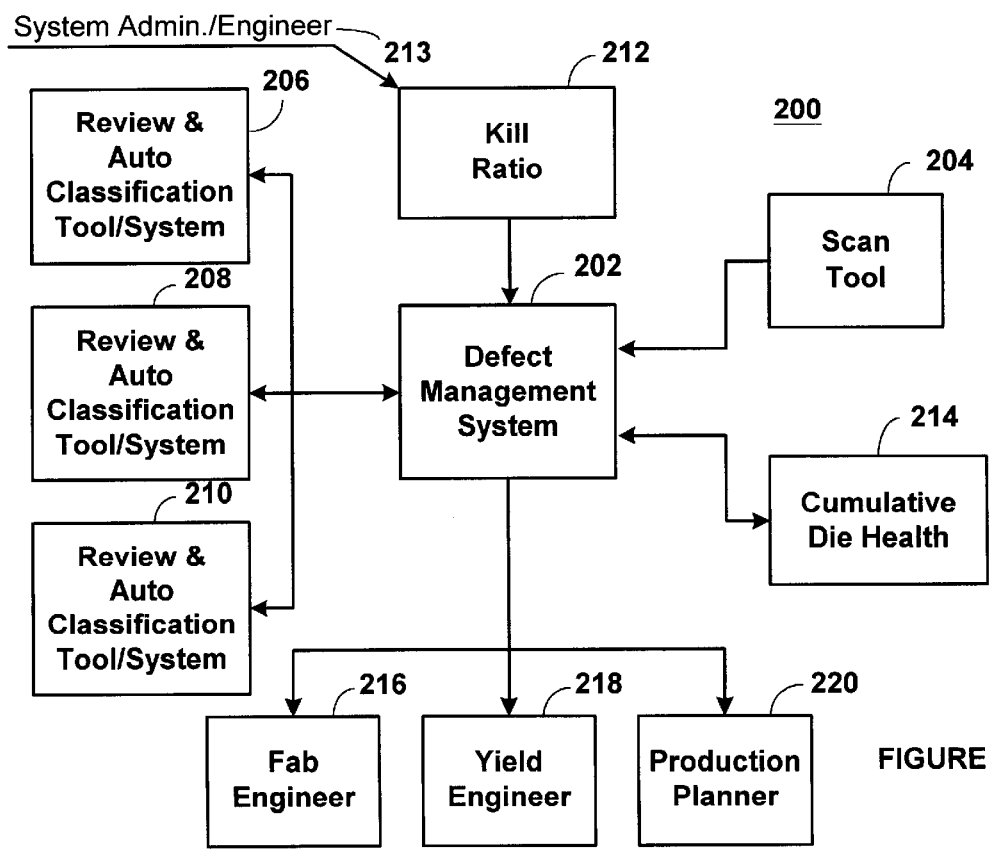
FIG. 2 illustrates an inspection methodology in accordance with a second embodiment of the present invention showing a defect management system having input from a scan tool, input from a kill ratio table, outputs and inputs to and from review and automatic classification tools, outputs to various after inspection stations, including a station manned by a fabrication engineer, a station manned by a yield engineer, and a station manned by a production planner, and an output and an input to and from a table tabulating cumulative die health.

FIG. 2 illustrates a second inspection methodology 200 showing a defect management system 202 having input from a scan tool 204 that is used to inspect wafers after selected process steps. The scan tool 204 captures defects and sends defect information and defect location information to the defect management system 202, which includes a relational data base. The defect management system 202 sends the defect information to review and automatic classification tools/systems 206, 208, and 210, which classify the defects as to type and size and then sends the defect information back to the defect management system 202. The defect classification information is correlated with kill ratio information tabulated in a kill ratio table 212 that has been developed by a system administrator/system engineer, as indicated at 213. The correlated data determines a kill ratio for each defect and the kill ratio is tabulated in a defect kill ratio table 214 that tabulates the cumulative die health statistic for all layers as the layers are inspected. A die health statistic is determined by combining the killer ratios of defects within any given die. For the first defect the kill ratio statistic is equal to 1 minus the kill ratio, for the next defect the kill statistic will be the current health statistic minus the current statistic times the new killer ratio and so on for new defects. For example, for a die having defects with kill ratios of 0.8 and 0.5, the die health statistic will be (1−0.8) or 0.2 for the first defect and (2−(0.2)(0.5)) or 0.1 for the two defects. The 0.1 indicates that the die is only "10%" healthy or only has a 10% chance of yielding. The die health statistic can be quickly tabulated to determine the effect of the defects at the current layer on yield and thus a determination can be made whether or not to continue processing the wafer based on current layer information. For example, if 40% of the dice have less than 20% probability of yielding with 70% of processing remaining, a determination can be made if it is worth continuing with the wafer lot and spending the processing efforts on new wafers. Although this information is valuable, the next step is to combine the health statistics from all the layer inspections to give a more accurate stacked wafer health statistic. This is accomplished by "stacking" the defects caught at each layer inspection by die and determining the die health statistic for each die by accumulating all the kill ratios for all the layers. The stacked wafer health statistic is calculated by adding all the die health statistic values from each die and dividing by the total number of die (given that dice with no defects have a die health statistic of 1). The defect information stored in the defect management system 202 is available for inspection at review stations such at a station 216 manned by a fabrication engineer, a station 218 manned by a yield engineer, and a station 220 manned by a production planner. As can be appreciated, the fabrication engineer studies the defect information to develop fabrication procedures or to find cures for problems identified during the inspection process, the yield engineer studies the defect information to predict yield information or to develop methods to increase the yield and the production planner studies the defect information to determine if there are methods to increase or improve the production of the semiconductor wafers.

Figure 3:
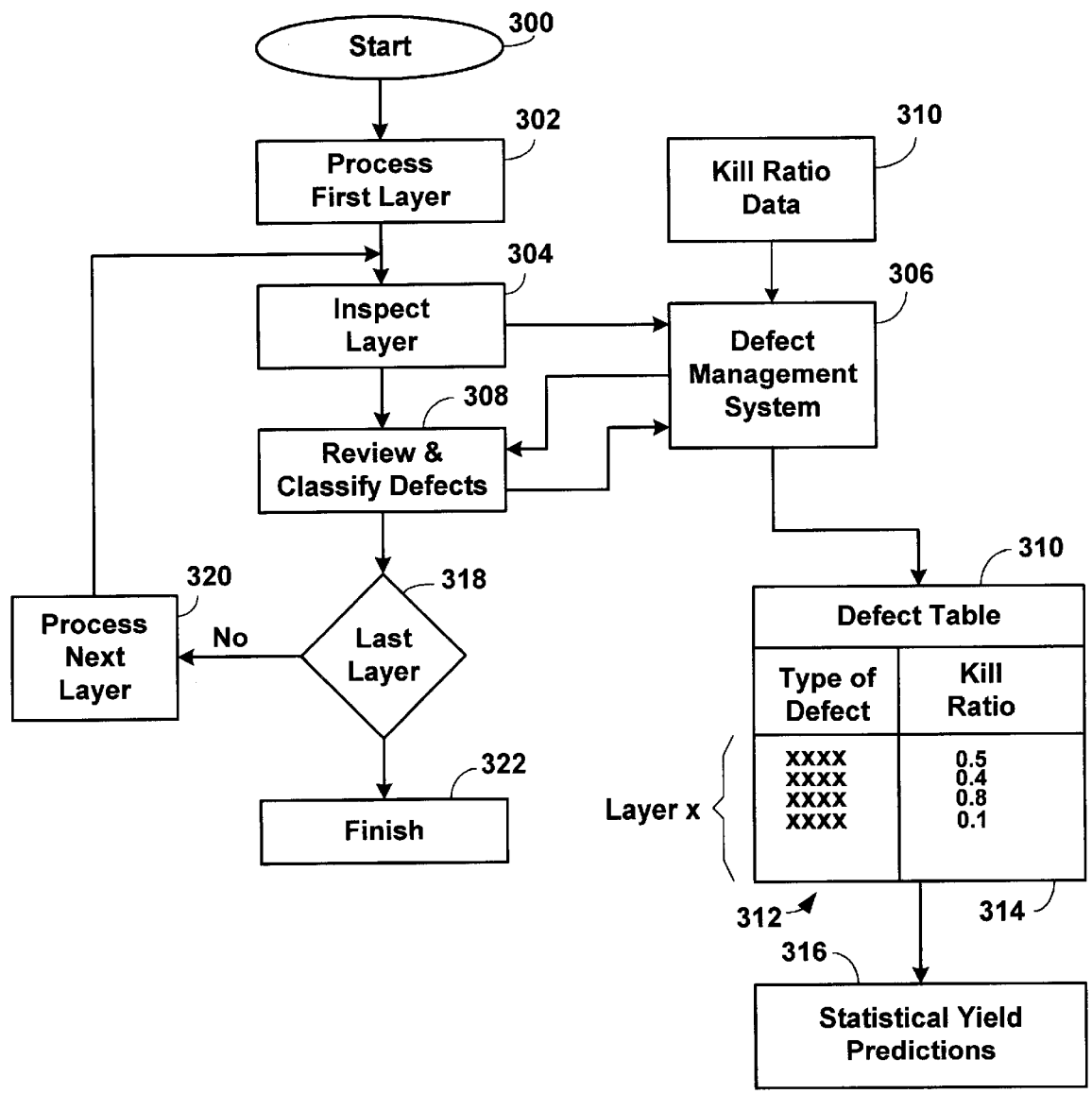
FIG. 3 is a flow diagram showing the manufacturing process of the inspection methodology shown in FIG. 1 showing the interaction of a defect management system with the manufacturing process and further showing the development of a defect table tabulating the type of defects and defect kill ratios by layer.

FIG. 3 is a flow diagram of the manufacturing process illustrated in FIG. 1. A wafer lot is started through a manufacturing process, as indicated at 300. The first layer of each wafer of the wafer lot is subjected to a first process, as indicated at 302. After the first process is completed, a selected number of wafers are inspected for defects at 304 and are typically referred to as inspection wafers. The defect data is sent to a defect management system 306. The inspection wafers are placed in review and classify tools and the defect management system 306 sends the defect data to review stations 308 where the defects are reviewed and classified. The review stations 308 send the defect classification information back to the defect management system 306. The defect management system 306 correlates the defect classification information with kill ratio data 310 that has been developed by a system administrator/system engineer. A defect kill ratio is determined for each defect and the defect and the associated kill ratio is tabulated in a defect ratio table 312. The defect table 310 has a first column 312 that lists the type (classification) of defect and a second column 314 that lists the associated kill ratio. A table similar to 310 is formed for each layer. The data in defect table 310 is analyzed to determine a statistical yield prediction, as indicated at 316. This method tabulates the type of defects and kill ratios for each type of defect and accumulates this data in defect table 310. This information is used, for example, as follows: if there are 10% pattern defects (because 10 of the 100 defects reviewed were pattern defects) then this information is extended to conclude that if there are 1000 total defects on the a particular layer, 100 (10% of the 1000) of the defects would be pattern defects. Because pattern defects have a kill ration of 1, it is assumed that there could be as many as 100 killed die on the wafer (as should be appreciated, a single die may actually have more than 1 of the total pattern defects—and you can't "kill" a die more than once). However, because the kill ratio or kill information is not tabulated by die, a later layer may show another killer defect on the same die and a faulty total killed die statistic would result. This results in faulty yield predictions.

After the layer just processed is completed, it is determined at 318 if the layer just processed and inspected is the last layer to be processed. If it is determined at 318 that the layer just processed and inspected is not the last layer, the next layer is processed, at 320 and the inspection wafers are inspected at 304. If it is determined at 318 that the layer just processed and inspected is the last layer, the wafers are finished, as indicated at 322.

Figure 4:
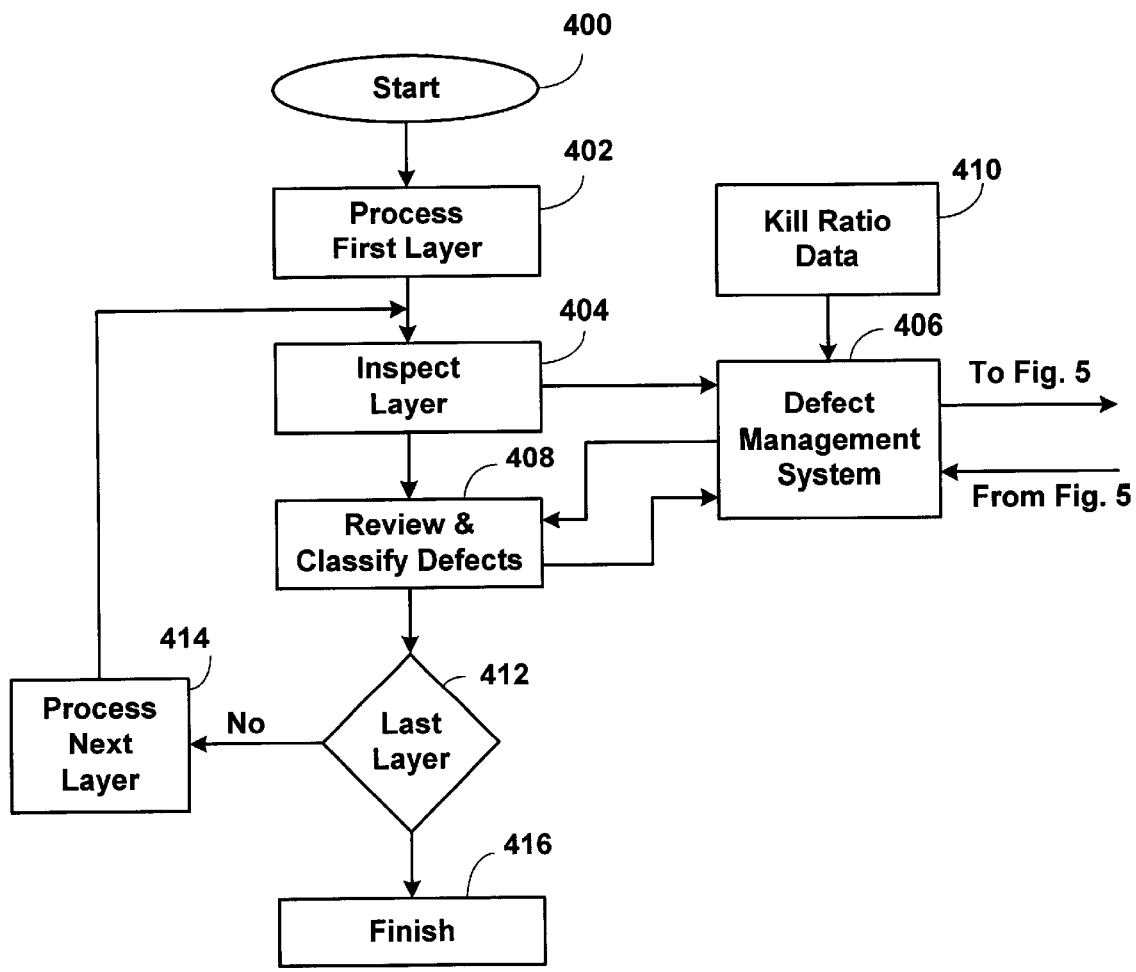
FIG. 4 is a flow diagram showing the manufacturing process of the inspection methodology shown in FIG. 2 showing the interaction of a defect management system with the manufacturing process and further showing the development of a stacked defect table shown in FIG. 5.
Figure 5:
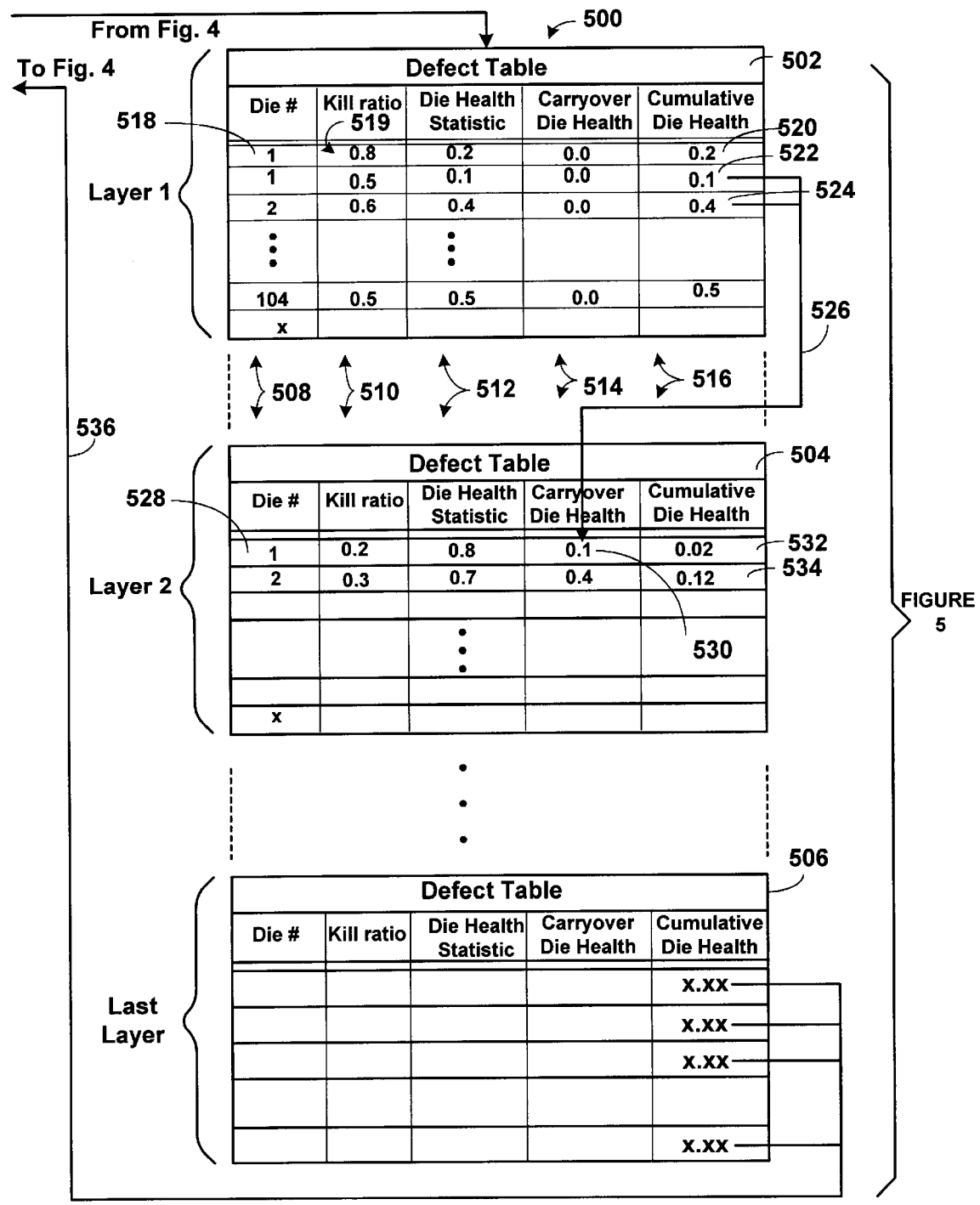
FIG. 5 shows the stacked defect table developed by the methodology shown in FIGS. 2 and 4.

FIGS. 4 & 5 each show a part of a flow diagram of the manufacturing process illustrated in FIG. 2. A wafer lot is started through a manufacturing process, as indicated at 400. The first layer of each wafer of the wafer lot is subjected to a first process, as indicated at 402. After the first process is completed, a selected number of wafers are inspected for defects at 404 and are typically referred to as inspection wafers. The defect data is sent to a defect management system 406. The inspection wafers are placed in review and classify tools and the defect management system 306 sends the defect data to review stations 408 where the defects are reviewed and classified. The review stations 408 send the defect classification information back to the defect management system 406. The defect management system 406 correlates the defect classification information with kill ratio data 410 that has been developed by a system administrator/ system engineer as described above. A defect kill ratio is determined for each defect and the defect and the associated defect kill ratio are sent to a stacked defect table 500 (FIG.

5) where the die # and associated kill ratio are tabulated in separate tables according to layer. For example, defect table 502 tabulates data for layer 1, defect table 504 tabulates data for layer 2 and defect table 506 is shown tabulating data for the last layer. As should be appreciated there are similar tables for all layers that are inspected from layer 2 to the last layer. The first column 508 lists the die # on which a particular defect has been caught. The second column 510 lists the kill ratio determined for the defect on the die # listed in the first column 508. As discussed above, the kill ratio is determined by correlating classification data generated by the review and classify stations 408 (FIG. 4) with kill ratio data 410 (FIG. 4). The third column 512 lists the calculated die health statistic. The fourth column 514 lists the carryover die health statistic from the preceding layer (as should be appreciated, there is no carryover die health statistic for layer 1). The fifth column 516 lists the cumulative die health statistic for the die # listed in the first column 508. As shown in defect table 502 it is indicated that die #1 has two defects, the first listed in row 1, 518. The first defect caught on die #1 (row 1, 518) is shown with a kill ratio value of 0.8 at 519. The die health statistic for the first defect is calculated by subtracting the kill ratio value from 1, that is, the die health statistic=(1−kill ratio)=(1−0.8)=0.2. The cumulative die health statistic for the first defect in die #1 is listed in the fifth column 516 at 520 and is the die health statistic calculated for the first defect on die #1. The die health statistic calculated for the second defect on die #1, taking into account the cumulative die health statistic for the first defect on die #1 where the second defect on die #1 has, for example, a kill ratio of 0.5 calculated as follows:

cumulative die health statistic−(kill ratio for second defect)(cumulative die health statistic)=cumulative die health statistic for the second defect.

Using the example shown in defect table 502, the numerical value for the cumulative die health statistic for die #1 for the first and second defect is as follows:

0.2−(0.5)(0.2)=0.2−0.1=0.1, which is tabulated in the fifth column 516 at 522. In this case, die #1 has two defects and the cumulative die health statistic for die #1 is shown at 522. Similarly, other die may have more than one defect and the cumulative die health statistic for each die would be the last listing for each die.

The cumulative die health statistic for die #2 is calculated to be 0.4 and is listed in the fifth column 516 at 524. Other cumulative die health statistics for each die are tabulated in the fifth column 516. The cumulative die health statistic for each die is carried over to the table for the next layer that is inspected, as indicated by arrow 526, and is tabulated in the fourth column 514 in defect table 504.

The second layer is processed and inspected and, as indicated at 528, die #1 has a defect having a kill ratio of 0.2. The die health statistic for that defect is thus (1−0.2)=0.8. The carryover die health statistic is 0.1, as indicated at 530, and the cumulative die health statistic for die #1, taking into account the die health statistic from earlier layers, is calculated from the following relationship:

cumulative die health statistic−(die health statistic for defect)(cumulative die health statistic) and is calculated as follows:

0.1−(0.8)(0.1)=0.02, which is tabulated in defect table 504 at 532. Similarly, the cumulative die health statistic for die #2 after the second process has been completed and tabulated in defect table 504 is 0.12 and is calculated as follows:

0.4−(0.7)(0.4)=0.12, which is tabulated in defect table 504 at 534.

After each manufacturing process is completed and inspected a defect table similar to the defect tables 504 & 506 is completed and stacked to form the stacked defect table 500. As discussed above, the cumulative die health statistic is tabulated in the fifth column 516 of each defect table. The cumulative health statistics are sent to the defect management system 406, as indicated by arrow 536, which can be programmed to prevent further processing of the wafer if the cumulative die health statistics for the stacked wafer reach a predetermined value that would make further processing of the wafer non-cost effective. Using the cumulative health statistic, yield managers can predict yield as the lot is being processed. The stacked wafer health statistic is obtained by adding all the die health statistics from every die and dividing by the total number of dice (given that dice with no defects have a die health statistic of 1). In addition, the defect management system can be programmed to not send any further defects found on dice that have a predetermined die health statistic for further review and classification at step 408 (FIG. 4). When all processes are completed, the final cumulative die health statistics tabulated in column 516 in defect table 506 (the defect table for the last layer of the wafer) are stored by the defect management system for use by reviewers such as fabrication engineers, yield engineers, and production planers to analyze the manufacturing process, improve yield and to plan future production.

Referring again to FIG. 4, after the layer just processed is completed, it is determined at 412 if the layer just processed and inspected is the last layer to be processed. If it is determined at 412 that the layer just processed and inspected is not the last layer, the next layer is processed, at 414 and the inspection wafers are inspected at 404. If it is determined at 412 that the just processed and inspected is the last layer, the wafers are finished, as indicated at 416.

The benefits of the present invention include, but are not limited to the following:

1. It provides information for dispositioning purposes.
2. It provides useful data for yield modeling.
3. It enables determination of effect of process experiments on yield.
4. It provides accurate statistics for correlation modeling.

In summary, the results and advantages of the method of the present invention can now be more fully realized. The method of the present invention thus effective provides a semiconductor manufacturing and inspection process for the manufacture of high performance integrated circuits that provides a first defect table in which defect type and associated kill ratios are tabulated by layer and a second stacked defect table in which the number of dice having defects and a calculated die health statistic are tabulated per layer. A cumulative die health statistic is determined per die and is carried over to the next layer defect table. The tabulated data is utilized to predict yield and analyze the manufacturing process.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, wherein the semiconductor devices are manufactured on a wafer, wherein each wafer includes multiple die each of which may become a semiconductor device, the method comprising:

(a) processing a first layer in a lot of semiconductor wafers;

(b) selecting at least one inspection wafer from the lot of semiconductor wafers;

(c) inspecting the first layer in the at least one inspection wafer for defects in a scan tool;

(d) generating defect data per die number in the scan tool;

(e) sending the defect data to a defect management system;

(f) generating classification data for each defect;

(g) correlating the defect classification data with kill ratio data;

(h) generating a defect table for the first layer and tabulating the die number and kill ratio for each die;

(i) calculating a die health statistic and a cumulative die health for the first layer for each die.

2. The method of claim 1 further comprising:

(j) determining if a layer just processed is a last layer on the lot of semiconductor wafers:

(k) if the layer just processed is the last layer go to step (r);

(l) processing a next layer on the lot of semiconductor wafers;

(m) inspect the next layer in the at least one inspection wafer for defects in a scan tool;

(n) repeat steps (d) through (g);

(o) generating a defect table for the next layer and tabulating the die number and kill ratio for each die;

(p) calculating a die health statistic and a cumulative die health for each die incorporating the cumulative die health for each die;

(q) go to step (j); and (r) stopping processing.

3. The method of claim 1 wherein calculating the die health statistic in step (i) is accomplished by subtracting the kill ratio for the defect from one.

4. The method of claim 1 wherein calculating the cumulative die health statistic for a second defect is calculated as follows: cumulative die health statistic−(kill ratio for second defect)(cumulative die health statistic)=cumulative die health statistic for the second defect.

* * * * *